(12) United States Patent
Flanagan et al.

(10) Patent No.: US 6,891,286 B2
(45) Date of Patent: May 10, 2005

(54) MAGNETOSTRICTIVE ACTUATOR (76) Inventors: Graham Flanagan, 39 Gorsedale, Sutton Park, Hull HU74AU (GB); William John Metheringham, Carr Far, Histon Road, Roos HU12 0JB (GB); David Johnson, 2 Main Street, Kilnwick, Driffield (GB), Y0259JD; Brian Douglas Smith, 15 Fairlawn Avenue, Cuiswick, London W4 5EF (GB)

( * ) Notice: Subject to any disclaimer, the term of this patent is extended or adjusted under 35 U.S.C. 154(b) by 0 days.

(21) Appl. No.: 10/913,582

(22) Filed: Aug. 6, 2004

(65) Prior Publication Data

US 2005/0029878 A1 Feb. 10, 2005

Related U.S. Application Data

(63) Continuation of application No. 10/472,718, filed as application No. PCT/GB02/01111 on Mar. 19, 2002.

(51) Int. Cl.[7] ............................................. H01L 41/06
(52) U.S. Cl. ............................ 310/26; 310/12; 381/117
(58) Field of Search .............................. 310/26, 12–15; 381/115–118, 199–201

(56) References Cited

U.S. PATENT DOCUMENTS

| 2,437,270 | A | * | 3/1948 | Peek, Jr. ...................... 367/168 |
| 5,451,821 | A | * | 9/1995 | Teter et al. .................... 310/26 |
| 5,739,601 | A | * | 4/1998 | Tsodikov ...................... 310/26 |
| 6,294,849 | B1 | * | 9/2001 | Teter ............................ 310/26 |

* cited by examiner

Primary Examiner—Thanh Lam
(74) Attorney, Agent, or Firm—Jackson Walker LLP (57) ABSTRACT

A magnetostrictive actuator comprises a rod of giant magnetostrictive material, biasing permanent magnets arranged at each end thereof and coaxially therewith so as to pass a magnetic field through the rod. An energizing electromagnetic coil is connected to an energizer so as to superimpose on the magnetic field passing through the rod an alternating magnetic field to cause variation in the length of the rod in response thereto. The permanent magnets are each in the form of a disc having a cross-sectional area substantially greater than that of the rod and are spaced from the ends of the rods by material of low magnetic permeability. The magnetic field in the rod is thereby substantially linear along the length thereof.

11 Claims, 6 Drawing Sheets

MAGNETOSTRICTIVE ACTUATOR

This application is a continuation of co-pending U.S. patent application Ser. No. 10/472,718, filed on Sep. 19, 2003, which is a 371 of PCT/GB02/01111, filed Mar. 19, 2002.

FIELD OF THE INVENTION

This invention relates to a magnetostrictive actuator especially suitable for audiofrequency use and to audio output and communication devices which may employ such an actuator.

BACKGROUND TO THE INVENTION

It is known that a panel may be made to function as a loudspeaker by attaching to the panel an audiofrequency actuator which can transmit acoustic signals into the panel. WO92/03024 discloses one such panel. WO98/52289 suggests the use of standard trim panels in a motor vehicle as a means of radiating the output of a radio, tape player or the like, listing magnetostrictive, electromagnetic, electrostatic and micromotor transducers as possible for the job, although preferring piezoelectric transducers.

While such panels can be made to operate as satisfactory loudspeakers, they all depend on attachment of the actuator to the panel, and the availability of mains power or a vehicle alternator output to drive them, for various reasons. Piezoelectric devices require high voltages and relatively large currents to produce suitable levels of audio power, while electromagnetic devices, although operating at low voltages, require very high currents to produce sufficient power to produce audible output from the panels. Magnetostrictive devices can generate a substantial force at a relatively low voltage, but have previously been impractical for portable domestic uses for two reasons. Firstly, the current consumption to generate the necessary magnetic fields to cause change in length of the giant magnetostrictive material (GMM) is relatively high, and secondly, the cost of the GMM would be prohibitive.

It has been found that simply scaling down conventional magnetostrictive actuators does not produce satisfactory audio output, with high levels of distortion or very low volume.

SUMMARY OF THE INVENTION

The present invention provides, in one aspect, a magnetostrictive actuator, comprising a rod of giant magnetostrictive material, a biasing permanent magnet arranged at each end thereof and coaxially therewith so as to pass a magnetic field through the rod, and an energising electromagnetic coil connected to energising means so as to superimpose on the magnetic field passing through the rod an alternating magnetic field to cause variation in the length of the rod in response thereto, wherein the permanent magnets are each in the form of a disc having a cross-sectional area substantially greater than that of the rod and are spaced from the ends of the rods by material of low magnetic permeability, such that the magnetic field in the rod is substantially linear along the length thereof.

The rod may comprise two or more pieces of GMM located end-to-end. For a given rod, it has been found that the axial distance between the two magnets is suitably approximately equal to or less than the diameter of the magnets.

The body of the actuator is formed of a non-magnetic material, for example a zinc alloy, rather than steel, as in conventional magnetostrictive actuators. Thus, a magnetic return path is not provided, and it has been found that this also helps to enhance the linearity of the magnetic field through the GMM.

The magnets preferably have a diameter at least three times the mean diameter of the rod, and more preferably at least four times. The thickness of the magnets is preferably substantially less than the diameter of the magnets. The spacing of each magnet from the end of the rod is preferably a distance at least equal to the thickness of the magnet. The aim is to ensure that none of the GMM is magnetically saturated, and that the magnetic field through the rod is as near parallel as possible to the longitudinal axis of the material.

The magnets are suitably of the neodymium-iron-boron high energy type. Other types of magnet could be used, but the field strength may be lower, and it is therefore less likely that there would be a linear field throughout the length of the GMM rod. The GMM rod is preferably less than 15 mm, more preferably 12 mm or less, and the width is preferably 4 mm or less. Typically, the rod will be of square section, say 4 mm by 4 mm.

It has been found that the use of large-diameter magnets gives a substantially linear magnetic field throughout the length of the GMM rod, thus ensuring that the magnetic field influences the greatest possible amount of the GM material, thereby maximising the response of the actuator to the applied energising field. The nonmagnetic spacers ensure that the amount of GMM required is minimised by avoiding magnetic saturation at the ends of the GMM rod.

It will be understood that the reference to "disc" is not intended to imply that the magnets must be circular in plan; other shapes may be equally effective, including square.

The invention further provides an audio device comprising a magnetostrictive actuator according to the invention, adapted to be located on a surface into which the actuator can couple acoustic waves into the surface, the audio device being such that the greater part of the mass thereof is supported by the actuator.

Another aspect of the invention provides a self-contained device for inducing acoustic waves into a panel such that the panel radiates audible sound, the device comprising a casing containing a power source, an audio frequency signal input, and an amplifier connected to the power source and to the signal input and providing an output signal to an audio frequency actuator adapted to couple acoustically with the panel when the device is brought into contact therewith, thereby producing an amplified audio output from the panel.

Yet another aspect of the invention provides a self-contained device for inducing acoustic waves into a panel such that the panel radiates audible sound, the device comprising a casing containing a power source, an audio frequency signal generating means, and an amplifier connected to the power source and to the signal generating means and providing an output signal to an audio frequency actuator adapted to couple acoustically with the panel when the device is brought into contact therewith, thereby producing an amplified audio output from the panel.

The audio frequency actuator is suitably a magnetostrictive actuator comprising a magnetostrictive element and an electromagnetic coil associated therewith, the coil being connected to the amplifier so that the output signal causes the element to deliver an output force which is modulated by said signal, and wherein means are provided for transmitting the output force to the panel when the device is brought into contact therewith.

More preferably, the actuator is of the type hereinbefore defined.

The signal generating means may be a player device for reproducing a recorded audio frequency signal, for example a recording tape player, a CD player, a DVD player, or a solid state memory device. Alternatively, the signal generating means may be a radio receiver, for example a broadcast radio receiver or a receiver for a locally-radiated radio signal, for example providing a wireless connection from a local signal source.

Another aspect of the invention provides an audio communications device having a microphone and an audio output circuit connected to an audio frequency actuator adapted to induce acoustic waves into a panel when the device is brought into contact therewith such that the panel radiates audible sound.

The communications device of the invention preferably includes a radio receiver/transmitter connected to the microphone and to the audio output circuit, and may, for example, be a cordless telephone handset of the type linked by radio (digital or analogue) to a base station which is wired to the public switched telephone network (PSTN). Cordless telephones of this general type are common in houses and offices. Alternatively, it may be an independent radio telephone, for example a cellular radio telephone. There have been some concerns about the use of such telephones, especially cellular telephones, and their possible effect on users' brains, since it is necessary to hold a source of microwave radiation, albeit weak radiation, close to the user's head to hear the output of the internal loudspeaker. While various "hands-free" solutions have been proposed, most require some electrical link between the telephone and an earphone, and this is thought by some to act as an antenna radiating towards the user's head.

Where the communications device of the invention is a telephone handset, it can be arranged to be used in one mode conventionally, by bringing it into close proximity with the user's ear, or in an alternative mode as a loudspeaking telephone simply by placing it on a horizontal surface such as a table or similar panel, or by attaching it temporarily to an upright surface such as a window, for example by a separate mounting bracket, by means of a suction attachment device as disclosed in our pending application GB0116303.9, by double-sided adhesive tape or using temporary adhesive material.

The device needs to be held in intimate contact with the surface for satisfactory acoustic coupling with the panel to occur, and the body of the handset will be designed to ensure that intimate contact can occur when the handset is simply resting on a horizontal surface, for example. An additional advantage of this property is that "conference calls" in which several people in the same room, for example, can participate in the same telephone call at the same time can be conducted without the need for special additional equipment. Since the actuator will still induce sound waves into the body of the handset, the handset may still be used in conventional manner when privacy is essential and conditions permit "hands-on" use.

Further advantages arise from this property of the device. Since the body of the handset radiates sound waves of sufficient amplitude to permit the output to be heard when the handset is held near to the ear, precise positioning of the handset relative to the ear becomes unnecessary—with conventional handsets having holes in the body next to the loudspeaker, alignment of the holes with the ear is necessary to achieve adequate sound volume, and this position may not be convenient for the comfort of the user. A further advantage is that, since holes through the casing are no longer necessary, the casing can more readily be made waterproof or at least water resistant. This has advantages when applied to communications devices used in adverse environments, for example those used by the military or the emergency services.

A further advantage is that the absence of feedback despite the close proximity of the microphone to the surface radiating the sound means that it is not necessary to employ special controls, whether software or hardware based, to avoid feedback problems, and the handset may be made smaller since the microphone—speaker separation distance is no longer important.

It will be seen that the handset according to one embodiment of the invention can be used in three main ways: spontaneously, as a hand-held device or one that permits communication through touch, or by simply resting the handset on a surface; short-term, by temporarily attaching the handset to a surface using a sucker attachment, for example, or by using double-sided adhesive or a temporary adhesive; or permanently, by adhering the device to a surface with a permanent adhesive, for example for car use where it is desired to ensure that any use will be on a hands-free basis, and not hand-held and therefore contrary to law. The latter case may be useful where the employer has a duty to ensure that the employee conforms with the law, and may have a legal liability where there has been failure to comply.

In another embodiment of the invention, the device is provided with a two-part attachment means, having a first part permanently attached to a surface which is to radiate sound, for example a desk-top or a window, and a second part connected to the actuator, the two parts being connectable together temporarily by a twist-locking or spring docking arrangement, for example.

In another embodiment, the device comprises means for connection to an existing telephone, for example a cord, or a plug connector directly engaging a socket in the telephone handset body (or vice versa). In the latter case, the device of the invention can serve as a "docking station" or may be arranged to couple permanently or temporarily using any of the methods indicated above. To enhance the acoustic coupling, the device may be designed so that the greater part of the mass thereof is carried by the actuator and therefore serves as a reaction mass therefor. For example, the actuator may be provided with a "foot" coupled directly to the GMM element and adapted to serve as the sole support for the device on the surface. The reaction mass will then include all those elements in the device which are rigidly supported by the actuator (spring-mounted elements such as batteries will not contribute to the enhancement of the coupling of the acoustic waves into the surface).

The magnetostrictive actuator may comprise a bar of magnetostrictive material, an electromagnetic coil surrounding the bar, a first permanent magnet located at one end of the bar with the south pole thereof directed towards the bar, a second permanent magnet located at the other end of the bar with the north pole thereof directed towards the bar, incompressible spacer means located between each magnet and the bar, said spacer means being of a material of low magnetic permeability, and magnetic circuit means extending from the outwardly-directed pole of the first magnet to the outwardly-directed pole of the second magnet.

Acoustic coupling may be improved by providing a thin layer of grease between each adjacent pair of components in the actuator, e.g. between the GMM bar and the spacers, and between the spacers and the magnets.

With this configuration, it is possible to construct an effective magnetostrictive actuator which has a very small size and weight, for example less than 75 g, and using only a small, and therefore less costly, quantity of magnetostrictive material. For example, a length of 12 mm or less is suitable, and preferably 10 mm or less, with a thickness of 4 mm or less. In an audio device, such an actuator can still produce sufficient audio output to permit it to be heard by a number of people in a typical office or home environment, for example.

According to a further aspect of the invention, a rear-view mirror unit for a motor vehicle comprises a mirror mounted as a front face of a hollow casing, the casing having audio input means connected to an audio transducer within the casing.

The audio transducer may be a conventional loudspeaker, for example a moving coil type of device, but is preferably a magnetostrictive actuator in contact with the rear face of the mirror and arranged to couple acoustically with the mirror thereby outputting sound therefrom.

The audio input means, which is preferably connected to the actuator via an amplifier, may comprise a connecting socket, for example to permit connection, via a suitable lead and plug, to a mobile telephone, permitting hands-free operation thereof in a motor vehicle, the mirror unit serving as a loudspeaker. The mirror unit may also include a microphone.

Alternatively, the mirror unit may include radio receiving means, for example of the type permitting connection to a mobile telephone or the like via a short-range radio link, one example of which might be that known under the trade mark Bluetooth.

Another way of connecting to a mobile telephone would be by way of an infrared link, for example of the type used to connect peripheral devices to computers.

The casing may be provided with a microphone connected to an audio output means such as a connecting socket for a wired connection to an external device such as a mobile telephone, or a wireless connection. The microphone may also be connected to electronic control circuits within the casing to permit, for example, voice-actuation of the unit.

Electronic control means within the casing may be alternatively or additionally be connected to a touch-operated device on the casing whereby a user can control operation of the device by touching the touch-operated device. The touch-operated device may be a simple push-button switch, or a non-moving switch such as an inductive or capacitive sensor.

The touch-operated device or button is suitably configured as a single-push button positioned towards the left hand side or middle lower centre of the casing, in the case of a right-hand drive car, to be pushed to acknowledge or open a call, when used in conjunction with a mobile telephone, or when pressed in the receive mode will cause access to voice dial as a voice prompt. To receive a call, means may be provided on the casing to indicate an incoming call, and the user will then press the button on the casing to open the call. Cancelling the call is achieved by pressing the same button. To initiate a call, pressing the button once may be arranged to open a tone that uses a voice tag attached to a recipient's name. The device may be arranged to mimic the voice tag to cause the telephone to dial the recipient.

Noise suppression circuitry and software may be incorporated into the device.

The mirror unit casing may be provided with an earpiece providing audio direct into a user's ear, the earpiece being connected to the audio input means via a wire which is provided with a rewind mechanism so that the earpiece may be pulled out of the casing and inserted into the ear to permit private listening, and then permitted to retract again under the influence of the rewind mechanism when no longer required. Extension of the earpiece may be arranged to disconnect the audio input from the audio actuator automatically. Similarly, a microphone may be provided which can be pulled out from the casing and, for example, clipped to the user's clothing, to permit speech at a lower level.

Other panels within the passenger compartment of a motor vehicle may be combined with the actuator to provide a sounder for reproducing sound audibly within the passenger compartment. For example, the sun visor for the front windscreen or windshield may be used, or a transparent screen overlying the instrument panel of the dashboard.

A still further aspect of the invention provides a communications system comprising a base station including a microphone and means for broadcasting a local radio signal carrying the audio output of the microphone, and a plurality of remote units, each remote unit being attached to a panel remote from the base station and having a radio receiver for selectively receiving the broadcast signal and for outputting an audio signal to an actuator arranged to couple acoustically with the panel, thereby rendering the audio signal audible in the region of the panel.

This provides a very flexible and less intrusive public address system, where local surfaces such as windows, doors, wall or ceiling panels, desks or other furniture can be made to radiate an audio signal. Another application would be the distribution of announcements at a public event without the need for high volume loudspeakers, which tend not only to direct sound where it is wanted, but also where it is not wanted.

The radio receivers may be individually addressable, for example by means of packet radio distribution techniques, permitting messages to be sent to individual locations. A possible application for this would be the provision of individually selected music to different tables in a restaurant, where the use of an actuator on the table surface ensures that the choice of music is heard at acceptable volume by those at the table, but does not intrude on those sitting at adjacent tables. Another possible example would be in museums and the like, where the actuators could be associated with a clipboard carried by visitors, for example schoolchildren taking notes, while announcements could be addressed to individuals or groups.

Yet another aspect of the invention provides a display device comprising a surface on or behind which information is displayed, an audio frequency actuator acoustically coupled to said surface for inducing into said surface acoustic waves causing the surface to radiate audible sound, and storage and playback means connected to said actuator for replaying a recorded audio signal.

Thus, for example, a public advertising display may be arranged to deliver an audible message to supplement or reinforce the message displayed visually on the display surface, which may be a static display such as a poster, or a dynamic display such as a video display, for example. The display device responds to the presence of a person in proximity to the device; what constitutes proximity will be determined by the location and the type of information being displayed and made audible, for example. The display may be a free-standing board type of display, or a display behind glass, for example behind a shop window, which serves as the surface to which the audio frequency actuator is coupled.

Sensor means may be provided for detecting the presence of a person in proximity to the surface and for causing operation of the storage and playback means to send an audio signal to the actuator in response to said detection. Alternatively, the display device may be provided with a switch operable by the viewer, or may be arranged simply to operate on a loop.

In yet another aspect of the invention, a helmet or hard hat has an audio frequency actuator acoustically coupled therewith, and is provided with means for supplying an audio frequency drive signal to the actuator.

The means for supplying the audio frequency signal may be a link to a separate radio communications device, or it may comprise a radio incorporated into the helmet. Such a helmet may be useful for fire fighters, permitting messages to be heard clearly in adverse conditions, since the helmet radiates sound around the head, permitting it to be heard without blocking out, or being blocked out by, ambient sound.

In an alternative embodiment, a helmet or protective hat comprises a shell having a headband mounted therein for locating the helmet or hat on the wearer's head, the headband carrying an audio frequency actuator connected to means for supplying an audio frequency drive signal thereto, the actuator being positioned so as to engage the wearer's head, in use, to couple acoustic energy directly into the wearer's skull.

BRIEF DESCRIPTION OF THE DRAWINGS

In the drawings, which illustrate exemplary embodiments of the invention.

DETAILED DESCRIPTION OF THE ILLUSTRATED EMBODIMENTS

Figure 1:
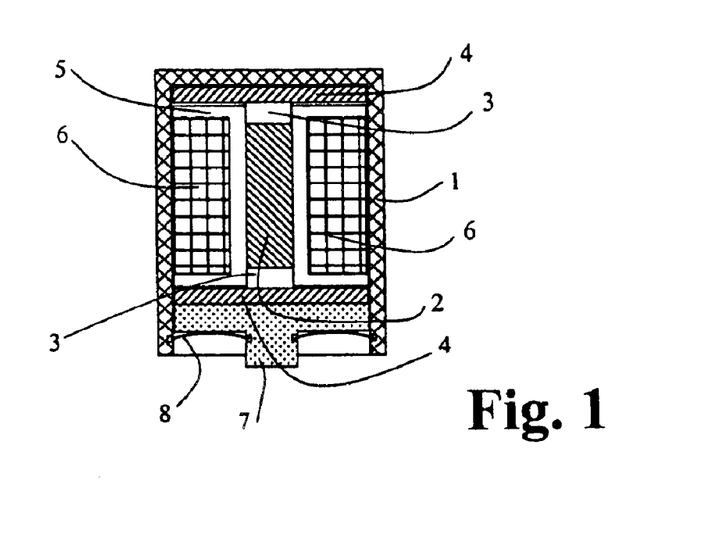
FIG. 1 is a cross-sectional view of the central part of an actuator according to the invention.

The magnetostrictive actuator shown in FIG. 1 comprises a casing 1, for example of a non-magnetic material, in which is located a rod 2 of giant magnetostrictive material (which for convenience may comprise two pieces of the GMM, end-to-end), with a non-magnetic spacer 3, for example of aluminium or a ceramic material capable of transmitting force, disposed at each end thereof to space the GMM rod 2 from a pair of disc magnets 4 of substantially greater diameter than the width of the rod. A plastics core 5 serves to locate and hold the GMM rod 2 and spacers, and carries an electromagnetic winding 6 which is connected via wires (not shown) to a separate energising signal source. A foot 7 transmits the force produced by the actuator to the desired location. A spring clip 8 held in grooves around the inside of the casing 1 and the foot 7 holds the assembly together and imposes a mechanical pre-stress on the GMM rod 2.

Figure 2:
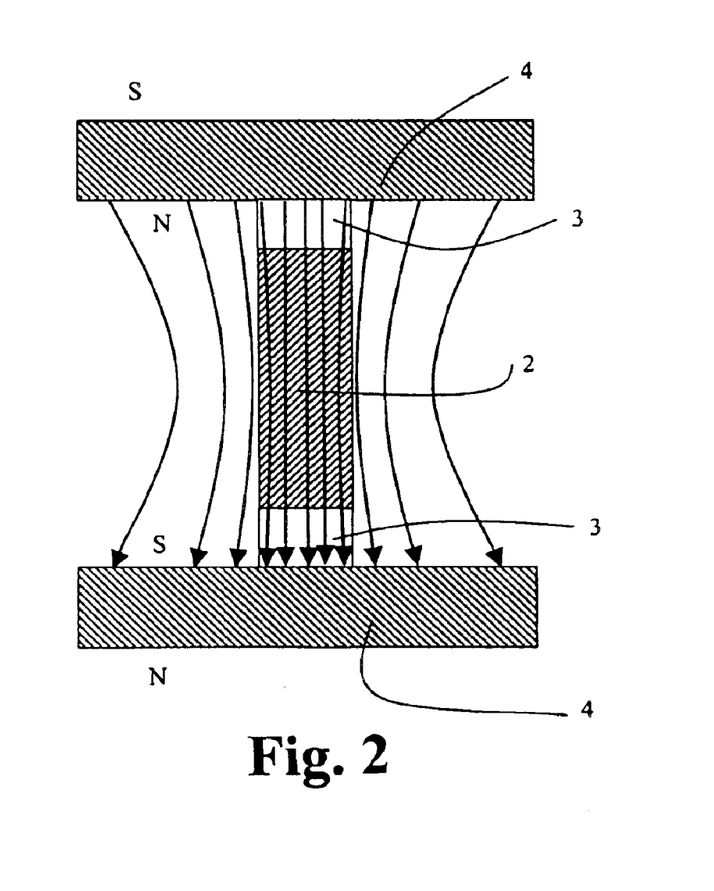
FIG. 2 is an enlarged view corresponding to the principal elements of FIG. 1, with typical magnetic lines of force superimposed thereon.

As may be seen more clearly from FIG. 2, by selecting disc magnets 4 of high energy, such as the neodymium-iron-boron type, and having a diameter substantially greater than that of the rod 2, the lines of force between the two magnets, although curved at the periphery of the magnets, will be substantially linear in the central region of the magnets coinciding with the area of the rod, thus ensuring the maximum magnetostrictive effect along the whole length of the rod. For a given length of rod, therefore, the extension achieved by a given magnetic field applied thereto is maximised.

Figure 3:
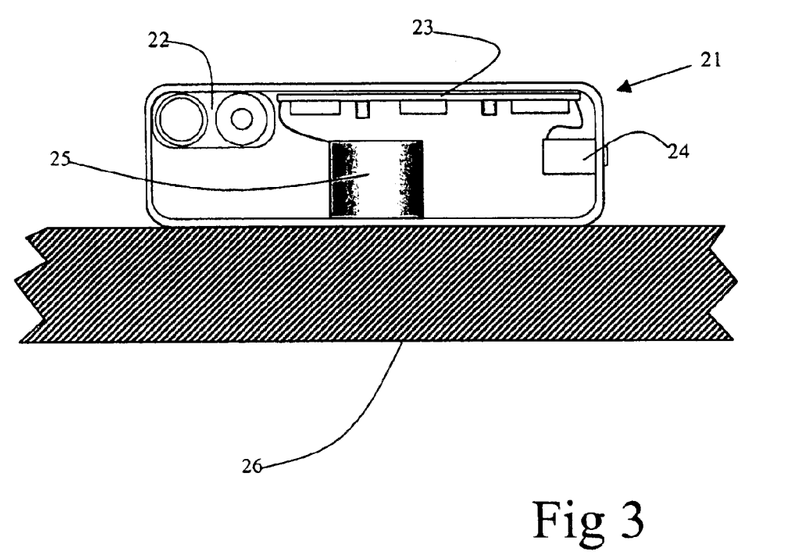
FIG. 3 is a cross-sectional diagram of an audio device according to one embodiment of the invention.

Referring now to FIG. 3, the audio device comprises a casing 21 contains batteries 22, typically replaceable dry cells or rechargeable cells, and an electronic circuit 23 including an amplifier powered thereby. An input socket 24 receives a connector plug, for example a miniature jack plug, on a connector lead to an external signal source, for example a personal stereo player, a mobile telephone or the like. The electronic circuit 23 within the audio device comprises a squelch circuit which detects the presence or absence of an input signal and switches the amplifier to a quiescent state when no signal is present to preserve battery life. The casing 21 has mounted therein a magnetostrictive actuator 25, for example of the type described hereinbefore with reference to FIGS. 1 and 2. The actuator is connected to the amplifier output so that the magnetostrictive material changes its length in response to the audio frequency signal output by the amplifier. The actuator is in intimate contact with the casing 21, which in turn can be brought into close contact with the surface of a panel such as a table 26, for example, or a window, so as to couple with the surface acoustically, inducing an acoustic wave within the panel. This causes the panel 26 to radiate sound.

Figure 4:
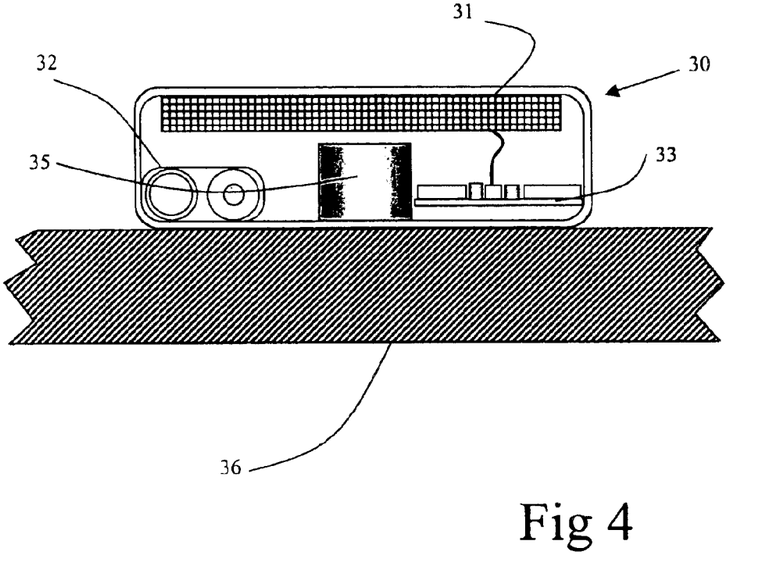
FIG. 4 is a similar diagram of an alternative embodiment of audio device.

In the audio player illustrated in FIG. 4, a casing 30 contains a disc player such as a Compact Disc player or MiniDisk player, shown diagrammatically at 31. The construction of such players is well-known and is therefore not shown or described in detail. The casing also contains batteries 32, typically replaceable dry cells or rechargeable cells, and an electronic circuit 33 including an amplifier powered thereby. The casing 30 has mounted therein a magnetostrictive actuator 35, for example of the type described hereinbefore with reference to FIG. 4. The actuator is connected to the amplifier output so that the magnetostrictive material changes its length in response to the audiofrequency signal output by the amplifier. The actuator is in intimate contact with the casing 30, which in turn can be brought into close contact with the surface of a panel such as a table 36, for example, or a window, so as to couple with the surface acoustically, inducing an acoustic wave within the panel. This causes the panel 36 to radiate sound. It will be understood that other audio sources may readily be substituted for the disc player 31, for example an FM or other radio receiver, a tape cassette player, or a solid state audio storage and playback device.

Figure 5:
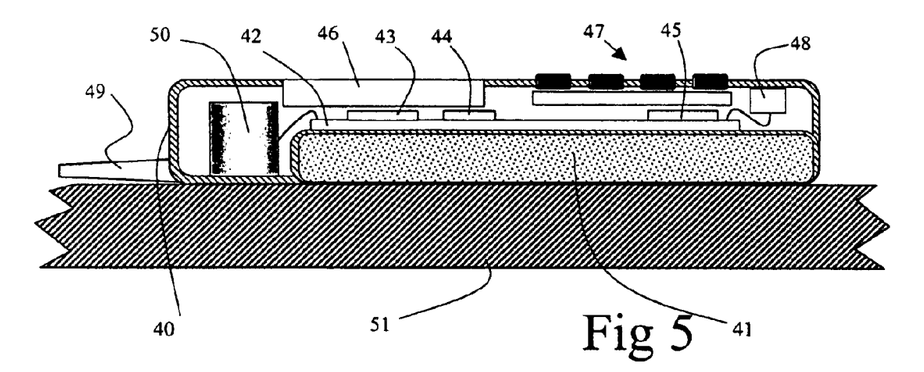
FIG. 5 is a cross-sectional diagram of an audio communications device according to another embodiment of the invention.

FIG. 5 shows a cellular radio telephone comprising, in conventional manner, a casing 40, containing a battery 41, a main circuit board 42 with electronic components 43, 44 and 45 thereon, a liquid crystal display screen 46, a keypad 47, a microphone 48, and an antenna 49. In place of the conventional loudspeaker, a magnetostrictive actuator 50 is mounted within and in contact with the casing 40, and is connected to the amplifier section of the main circuit board, which is adapted to provide a suitable driving output for the actuator 50.

In use, the telephone can be used in conventional manner (the first mode), being held to the side of the face so that the microphone is adjacent to the mouth, while the actuator part of the body is adjacent to the user's ear. The actuator 50 will in these conditions cause the casing 40 to radiate sufficient sound energy to permit the user to hear its output in the conventional way, so the exact positioning of the handset relative to the ear is not critical. For hands-free or conference use, however, the telephone may be placed on a panel such as a table 51 (the second mode). The actuator 50 then couples the acoustic energy into the panel, causing it to radiate the sound at a level sufficient to enable the sound to be heard in the vicinity thereof. A conventional microphone will typically have sufficient sensitivity to pick up speech and other sound from the vicinity, but automatic gain control may ensure that the sensitivity is adjusted to suit the circumstances of use, so that the sound volume transmitted by the telephone is not excessive when the telephone is used conventionally.

It will be seen that an advantage of the telephone of the invention is that there is no need for any adaptation or adjustment to change from hand-held to hands-free use and vice versa; the adaptation is automatic as a result of the dual mode capability of the telephone.

Figure 6:
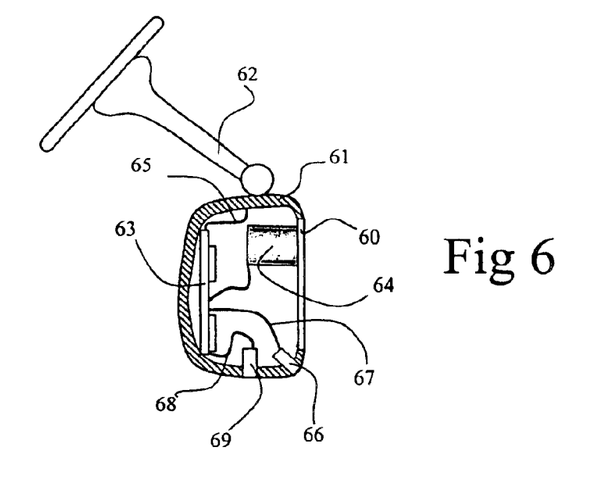
FIG. 6 is a cross-sectional diagram of a rear-view mirror in accordance with the invention.

In the rear-view mirror unit shown in FIG. 6, the mirror 60 is held in the open front face of a housing 61 which is mounted via a bracket 62 to the vehicle windscreen or to the inner roof surface above the windscreen. The mirror will typically be mounted within the housing 61 in a swivel mechanism to permit it to be adjusted to avoid glare from following headlights; this mechanism is omitted from the Figure for the sake of clarity, as it has no effect on the features of the invention. The casing 61 contains an electronic circuit board 63 mounting electronic components providing inter alia an amplifier, connected to a magnetostrictive actuator 64 which is mounted in intimate contact with the rear face of the mirror 60, for example by means of adhesive. Power is supplied to the circuit board 63 from the vehicle's electrical system through a supply lead 65 which runs through the mounting bracket 62. A microphone 66 is mounted within the housing so as to receive sound from within the vehicle's passenger compartment, and this is then connected to the circuit board via a connecting cable 67. The circuit board 63 is also connected via a further cable 68 to a socket 69 opening through the housing.

The socket 69 permits connection via an external lead and plug (not shown) to a cellular telephone in such a manner that speech received by the microphone 66 is sent to the telephone to be transmitted in the usual way, while speech received by the telephone is passed via the amplifier on the circuit board 63 to the magnetostrictive actuator 64, which then couples acoustic energy into the mirror, causing it to radiate sound within the vehicle passenger compartment so that it is audible to people sitting in the compartment. In this way, the mirror unit can permit hands-free operation of the telephone, with the sound emanating from a location adjacent the windscreen of the vehicle, ensuring that the driver's attention is not distracted from the road. There is a risk that sound from another direction will tempt the driver to look towards the source of the sound in a conversation, and thus divert attention from the road ahead, and the mirror unit according to the invention avoids this happening.

Figure 7:
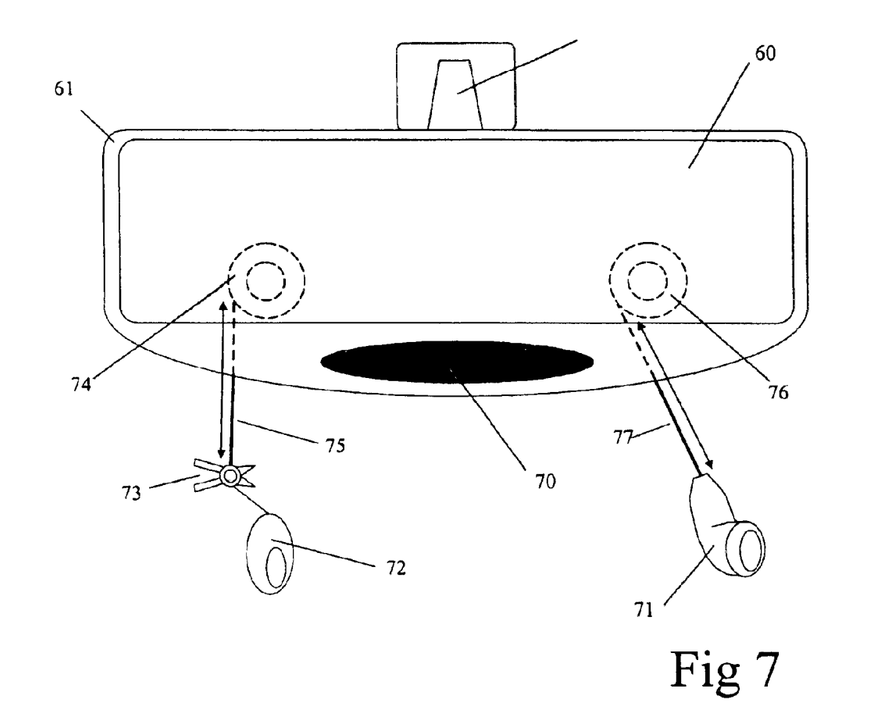
FIG. 7 is a front view of an alternative form of rear-view mirror for a vehicle.

In FIG. 7, the casing 61 contains a first spring-biased reel 74 which carries an electrical lead 75 connected to a microphone 72 provided with a clip 73 to permit it to be clipped on to clothing in a position wherein it can pick up the user's voice. The reel 74 ensures that, when the microphone is released, the lead 75 is wound back into the casing, while permitting it to be pulled out again for use. A second spring-biased reel 76 carries a lead 77 connected to an earphone 71 which the user can pull out and insert into an ear for private use of the device. The second reel 76 is arranged to switch off the actuator connected to the mirror 60 so that only the user can hear the returning audio signal. It will be appreciated that a single reel mechanism may be provided to control release and re-winding of the separate leads or, preferably, a single cable which is split adjacent the free end thereof to carry a microphone and an earpiece respectively.

A push-button 70 is provided in the lower part of the casing 61 to provide a single operating control for the device operating according to context. For example, when the device is in the standby state, pressing the button will initiate a call, for example permitting voice-actuated dialling, while when a telephone call is received, pressing the button will answer the call. It may be possible to provide for other functions to be accessed by pressing the button, perhaps by means of multiple presses, or even by means of a voice menu system, with a single push of the button 70 being used to select an item from the menu. In this way, the driver of a motor vehicle can control the audio device without the need to take his or her eyes from the road.

Figure 8:
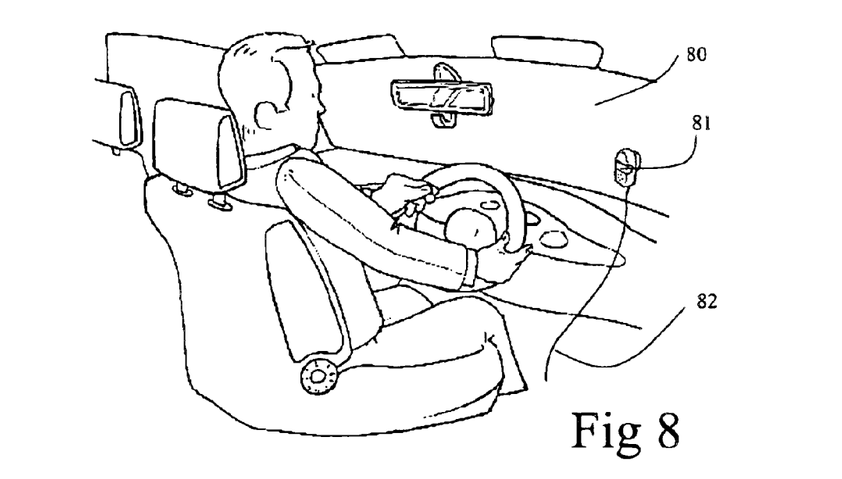
FIG. 8 is a view of an interior of a motor car with a magnetostrictive actuator installed therein.

FIG. 8 illustrates the interior of a motor car, in which a magnetostrictive actuator 80 is attached to the windscreen 81, for example by adhesive or by temporary attachment means such as a suction cap, and couples acoustic energy into the windscreen so that it acts as a loudspeaker to radiate sound into the car. The actuator 80 is connected to an audio signal source such as a cellular telephone or a car radio or music player by means of a cord 82, or by a short-range radio connection. It will be appreciated that the windscreen is only one of many panels within a vehicle which could be used to radiate sound. For example, an interior door panel or roof panel could be used, or a parcel shelf.

Figure 9:
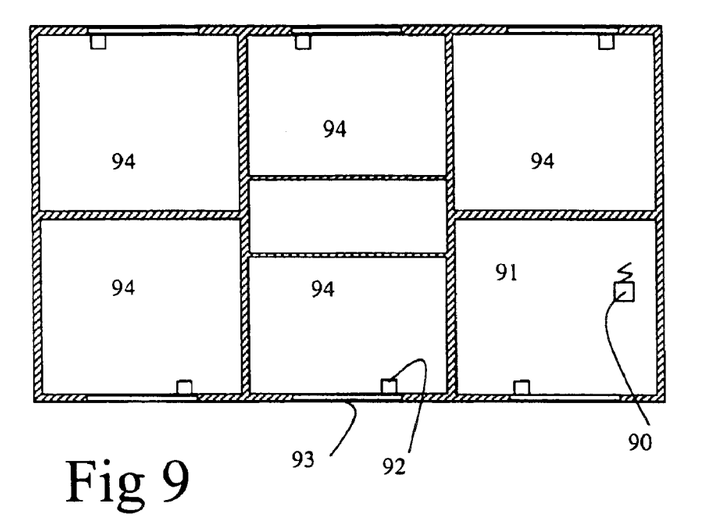
FIG. 9 is a plan view of a building incorporating a communications system in accordance with yet another embodiment of the invention.

FIG. 9 illustrates a communications system for a building, for example permitting speech transmitted from one room to be heard in a selected one of the other rooms, or in all rooms. The system comprises a base station 90 located in one room 91, and a receiver 92 mounted on the window 93 in each other room 94. The base station 90 comprises a microphone and means for transmitting a radio signal carrying addressing coding indicating which of the receivers is to be addressed (for a general announcement, this may be all receivers, or a selected group of receivers). Each receiver 92 includes a radio receiver and a magnetostrictive actuator, for example in accordance with the invention, arranged within the receiver so as to couple acoustically with the window to cause the window to radiate sound into the room. It will be appreciated that each room could also be provided with a base station permitting two-way communication.

Figure 10:
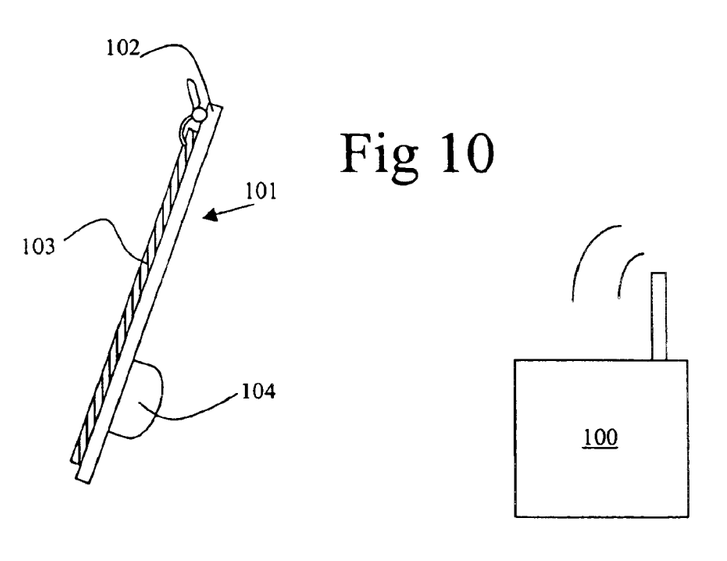
FIG. 10 is a diagrammatic view of an alternative form of communications system.

FIG. 10 illustrates another embodiment of the communications system, in which a base station 100 includes an audio signal source, which may be a microphone or a storage medium (solid-state memory, tape, CD, or other), and a short-range radio transmitter, for example of the type known under the trade mark Bluetooth. Each remote unit 101 is in the form of a clipboard 102, which can conveniently carry a notepad 103 or printed information leaflets, having a radio receiver and transducer device 104 mounted on the rear face thereof. The device 104 receives the signal transmitted by the base station 100 and coverts this to an audio frequency drive signal which is fed to a magnetostrictive transducer, of the type disclosed and claimed herein, connected to the board so as to couple acoustic energy into the board, thereby causing it to act as a loudspeaker, permitting the audio signal to be heard in the vicinity of the board, but not at a sound volume that will significantly interfere with the listening of others nearby.

Figures 11, 12:
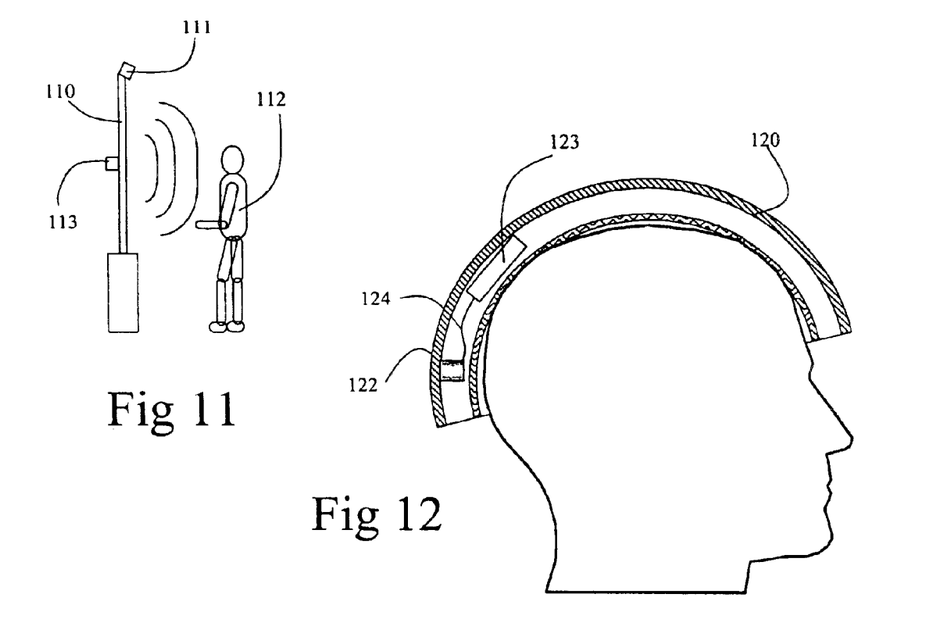
FIG. 11 is a schematic side elevation of a display device in accordance with the invention.
FIG. 12 is a schematic sectional view through a helmet in accordance with another aspect of the invention.

FIG. 11 shows an advertising or like display device comprising an advertising display panel 110 having detector means 111 mounted thereon, for example a passive infra red detector, to detect the presence of a person 112 adjacent to the panel. In response to detection of the person 112, the detector means signals to an announcement device 113 which causes a recorded message to be played via a magnetostrictive actuator coupled to the rear face of the panel. The actuator is suitably of the type described herein, being small and cheap to manufacture, while giving acceptable sound quality and volume. The announcement may enhance the message displayed on the panel, or give location or other information.

The helmet shown schematically in FIG. 12 is, for example, a fire fighter's helmet (it will be appreciated that the Figure does not seek to provide an accurate representation of any particular such helmet). The helmet comprises an outer hard shell 120 and inner padding or webbing 121 to space the wearer's head from the shell and to render the helmet comfortable to wear. A magnetostrictive actuator 122 is mounted in the space between the wearer's head and in contact with the outer shell 120 so as to couple acoustically with the shell. In this way, the whole of the shell can be made to radiate an audio signal, for example a radio message, in such a way that the wearer can hear the message while at the same time hearing ambient sound. The actuator may be connected to an external radio device, but in the embodiment illustrated, a small radio device 123 is mounted within the helmet and is connected via a lead 124 to the actuator 122.

Figure 13:
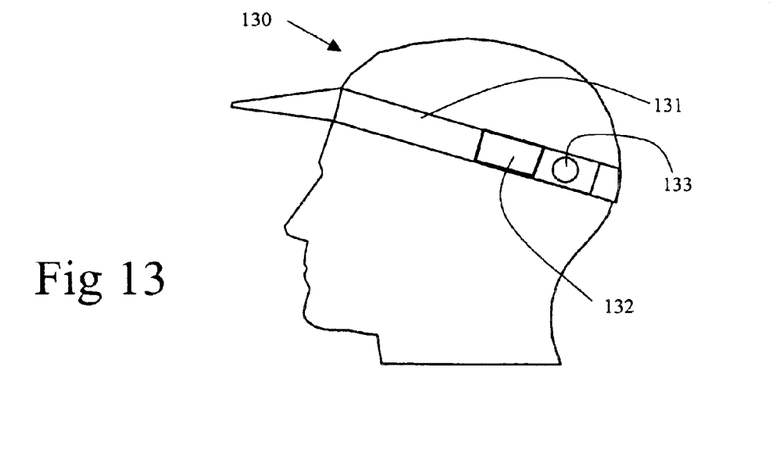
FIG. 13 is a schematic view of a hat in accordance with yet another aspect of the invention.

FIG. 13 shows a cap 130 having a headband 131 on which is mounted an audio signal source 132, such as a radio receiver or a solid-state audio player, and a magnetostrictive transducer 133, for example of the type hereinbefore described. The actuator 133 is mounted so that the foot thereof makes contact with the wearer's skull and couples acoustic energy into the skull. The wearer therefore hears the audio signal by bone conduction, the signal being substantially inaudible to anyone else. Batteries to power the device may be mounted on another part of the headband.

It will be appreciated that, while the arrangement illustrated in FIG. 13 is a simple cap, it is equally applicable to other types of headgear, for example protective helmets, especially for use in noisy environments where ordinary loudspeaking devices or headphones may be ineffective, or where it is important that the audio signal should not be overheard by anyone else.

What is claimed is:

1. A magnetostrictive actuator, comprising a rod of giant magnetostrictive material, a biasing permanent magnet arranged at each end thereof and coaxially therewith so as to pass a magnetic field through the rod, and an energising electromagnetic coil connected to energising means so as to superimpose on the magnetic field passing through the rod an alternating magnetic field to cause variation in the length of the rod in response thereto, wherein the permanent magnets are each in the form of a disc having a cross-sectional area substantially greater than that of the rod and are spaced from the ends of the rods by material of low magnetic permeability, such that the magnetic field in the rod is substantially linear along the length thereof.

2. An actuator according to claim 1, wherein the rod comprises two or more pieces of GMM located end-to-end.

3. An actuator according to claim 1, wherein the axial distance between the permanent magnets is equal to the diameter of the magnets.

4. An actuator according to claim 1, wherein the body of the actuator is formed of a non-magnetic material.

5. An actuator according to claim 1, wherein the magnets have a diameter at least 3 times the mean diameter of the rod.

6. An actuator according to claim 5, wherein the magnets have a diameter at least 4 times the mean diameter of the rod.

7. An actuator according to claim 1, wherein the magnets are of the neodymium-iron-boron high energy type.

8. An actuator according to claim 1, wherein the thickness of the magnets is substantially less than the diameter thereof.

9. An actuator according to claim 1, wherein the magnets are spaced from each end of the rod by a distance at least equal to the thickness of each magnet.

10. An actuator according to claim 1, wherein the length of the rod is 12 mm or less.

11. An actuator according to claim 1, wherein the width of the rod is 4 mm or less.

* * * * *